(12) United States Patent
Vijayrao et al.

(10) Patent No.: US 11,570,930 B2
(45) Date of Patent: Jan. 31, 2023

(54) IC PACKAGE WITH EMBEDDED FAN-BASED COOLING SYSTEM

(71) Applicant: Meta Platforms, Inc., Menlo Park, CA (US)

(72) Inventors: Narsing Krishna Vijayrao, Santa Clara, CA (US); David Sebastien Mortenson, Redwood City, CA (US)

(73) Assignee: Meta Platforms, Inc., Menlo Park, CA (US)

( * ) Notice: Subject to any disclaimer, the term of this patent is extended or adjusted under 35 U.S.C. 154(b) by 0 days.

(21) Appl. No.: 17/177,939

(22) Filed: Feb. 17, 2021

(65) Prior Publication Data

US 2022/0264765 A1   Aug. 18, 2022

(51) Int. Cl.
*H05K 7/20* (2006.01)

(52) U.S. Cl.
CPC ..... *H05K 7/20209* (2013.01); *H05K 7/20154* (2013.01); *H05K 7/20172* (2013.01); *H05K 7/20463* (2013.01)

(58) Field of Classification Search
CPC .......... H05K 7/20209; H05K 7/20154; H05K 7/20172; H05K 7/20463; H01L 23/467
See application file for complete search history.

(56) References Cited

U.S. PATENT DOCUMENTS

| 5,296,775 | A | * | 3/1994 | Cronin | F04D 25/08 |
| | | | | | 310/40 MM |
| 2006/0138905 | A1 | * | 6/2006 | Gonzales | H01L 41/094 |
| | | | | | 257/E23.099 |

FOREIGN PATENT DOCUMENTS

| EP | 2239775 A2 | 10/2010 | | |
| JP | S6045042 A | 3/1985 | | |
| JP | 06-177298 A | * | 12/1992 | ........... H01L 23/467 |
| JP | 2002-076210 | * | 3/2002 | ............. H01L 23/34 |

OTHER PUBLICATIONS

International Search Report and Written Opinion for International Application No. PCT/US2022/016243 dated Jun. 27, 2022, 11 pages.

* cited by examiner

*Primary Examiner* — Mukundbhai G Patel
(74) *Attorney, Agent, or Firm* — Greenberg Traurig, LLP

(57) ABSTRACT

The disclosed IC package may include (1) an IC die carrying electronic circuitry, (2) an encapsulation material that at least partially covers the IC die, where the encapsulation material defines a plurality of cavities in a top surface of the encapsulation material, (3) a plurality of microfans located in the plurality of cavities, and (4) a plurality of sensors embedded in the encapsulation material, where each sensor of the plurality of sensors produces a signal indicating a temperature at a location of the sensor. Various other IC packages, as well as associated cooling systems and methods, are also disclosed.

20 Claims, 5 Drawing Sheets

Cooling System 400

IC PACKAGE WITH EMBEDDED FAN-BASED COOLING SYSTEM

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
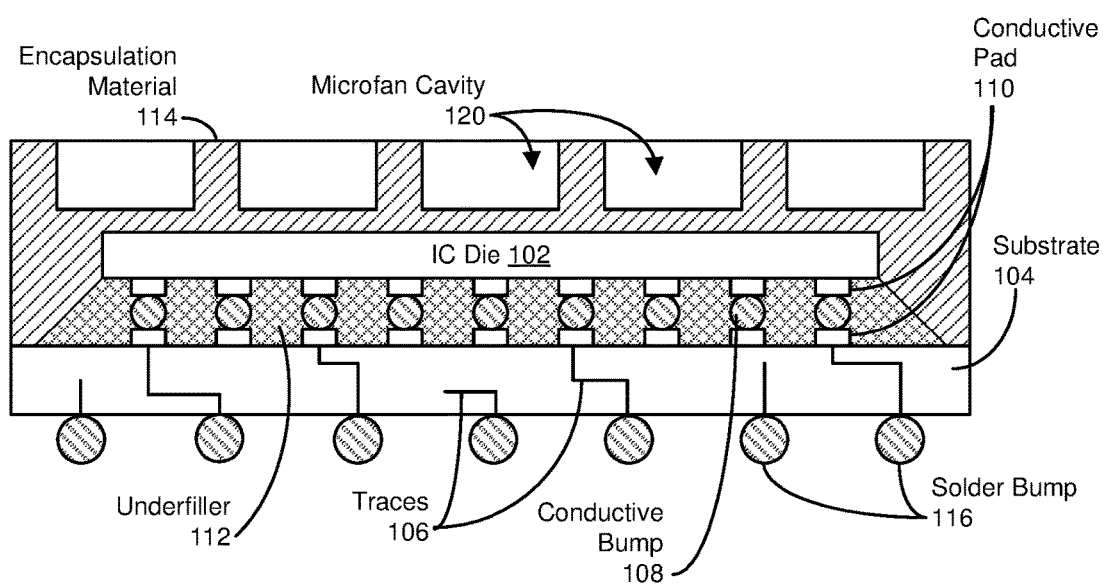
FIG. 1 is a side cross-section of an exemplary integrated circuit (IC) package configured to implement an embedded fan-based cooling system for the IC package.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

As integrated circuit (ICs) designers and fabricators continue to increase the functionality and speed available within a single IC package, the amount of power consumed, and thus the amount of heat dissipated, by the IC continues to increase similarly. Consequently, those ICs that tend to consume the most power, including, but not limited to, central processing units (CPUs), graphics processing units (GPUs), and the like, are traditionally the focus of most IC-specific passive heat mitigation efforts.

Depending on the size of the IC package, the circuit design of the IC, the speed at which the IC is to be operated, and other factors, the maximum amount of heat to be dissipated under a maximum expected workload (often referred to as the "thermal design power" (TDP) of the IC) may indicate whether an IC-specific heat mitigation strategy is required. In some examples, a TDP of at least 150 watts (W) may indicate the need for a passive heat sink. Typically, a heat sink (e.g., fashioned from an aluminum alloy, copper, or other metal) is coupled to a top flat surface of the IC package using a thermal adhesive to maximize heat transfer from the top of the IC package to the heat sink. Further, the heat sink may incorporate a number of fins or similar physical features to increase an amount of surface area of the heat sink. Air flow across the fins of the heat sink may then serve to remove thermal energy from the heat sink to increase the cooling effect of the heat sink on the corresponding IC package. In some examples, this air flow may be provided by way of a separate fan installed in an enclosure that surrounds the IC package and other circuitry, or via an IC-specific fan coupled more directly to the heat sink.

IC packages with higher TDPs, such as those exceeding 400 W, may benefit from the use of a liquid cooling system coupled to a top of the IC package. Such a system may include tubing that carries a liquid (e.g., distilled water) by way of a pump to a metallic device (e.g., a water block) that is coupled to the top of the IC package, as well as a radiator. In operation, the liquid is pumped through the water block (e.g., to extract heat from the IC package) and through the radiator (e.g., to extract the heat from the liquid, possibly assisted by an external fan).

The ability of heat sinks, water blocks, and other devices that may be attached to a top external surface of an IC package to extract a sufficient amount of heat therefrom continues to be challenged, as ICs with increasing TDPs (e.g., 1 kW or more) continue to be proposed and designed.

The present disclosure is generally directed to an IC package with a plurality of microfans (e.g., fans of several millimeters in diameter) embedded therewithin. Also included within the IC package may be a plurality of sensors (e.g., heat sensors) distributed therein. Control logic, which may be incorporated within the IC package or located external thereto, may individually control the operation of each of the plurality of fans based on the signals received from the plurality of sensors to maintain a desired temperature level for the IC. As will be explained in greater detail below, embodiments of the present disclosure may facilitate greater heat extraction than more conventional technologies, thus supporting the use of high-TDP ICs.

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-5, detailed descriptions of IC packages with a plurality of embedded microfans, as well as associated cooling systems and methods employing such packages. An exemplary IC package configured to implement an embedded fan-based cooling system for the package is described in conjunction with FIGS. 1 and 2. In association with FIG. 3, the exemplary IC package, including an installed plurality of microfans and associated sensors, is discussed. An exemplary cooling system including the exemplary IC package, as well as an exemplary method of operating such a cooling system, are explained in connection with FIGS. 4 and 5, respectively.

FIG. 1 is a side cross-section of an exemplary IC package 100 that is configured to implement an embedded fan-based cooling system. In the description of IC package 100, various directional references (e.g., top, bottom, up, down, and so on) are provided relative to the horizontal orientation of IC package 100, as illustrated in FIG. 1. However, such directional references are provided only for explanatory purposes, and other orientations of IC package 100, when deployed in an electronic system, are also possible.

As depicted in FIG. 1, IC package 100 may include an IC die 102 that carries electronic circuitry, the operation of which may generate heat. To enable electrical connection to various portions of the circuitry carried by IC die 102, a plurality of conductive pads 110 coupled to various points of the circuitry may be distributed (e.g., in a two-dimensional grid) along one or more surfaces (e.g., along the bottom) of IC die 102. Further, in some embodiments, corresponding conductive pads 110 may be provided along a surface (e.g., along the top) of a substrate 104 to be positioned under ID die 102. Substrate 104 may be a multilayer organic substrate, although substrate 104 may include other types of materials and/or structures in other examples. Substrate 104 may include a plurality of traces 106 that conductively couple conductive pads 110 along the top of substrate 104 to a plurality of solder bumps 116 along an opposing surface (e.g., along the bottom) of substrate 104. In some examples, solder bumps 116 may be spaced to facilitate electrical connection with corresponding pads of a printed circuit board (PCB) (not shown in FIG. 1), such by heat or another soldering process. Also, in some embodiments, conductive pads 110 of IC die 102 may be electrically connected to corresponding conductive pads 110 of substrate 104 by way of conductive bumps 108 (e.g., solder bumps). In addition, in some embodiments, after coupling IC die 102 to substrate 104, as described above, an underfiller 112 made of a nonconductive substance may be applied (e.g., heated and flowed) between IC die 102 and substrate 104 such that, when underfiller 112 cools, the combination of IC die 102, substrate 104, and underfiller 112 forms a mechanically stable structure in the presence of physical shock, extreme heat, and/or other challenging physical events.

While FIG. 1 depicts a particular structure that includes IC die 102 and an interconnection structure for facilitating electrical connection between IC die 102 and a PCB or other electronic structure, other structures involving IC die 102 may be employed in IC package 100 in other embodiments.

To facilitate protection of IC die 102 from a variety of environmental conditions, an encapsulation material 114 (e.g., an epoxy that is molded over IC die 102) may be applied over IC die 102, as well as possibly substrate 104 and underfiller 112. Conventionally, passive cooling systems, such as heat sinks, are applied to an external surface of such an encapsulation material to facilitate the cooling of the associated IC package. Instead, as illustrated in FIG. 1 and described more fully below, encapsulation material 114 may define a plurality of cavities 120 in a top surface of encapsulation material 114 that are configured to include a plurality of microfans (not depicted in FIG. 1) such that operation of one or more of the microfans may facilitate extraction of heat that is generated from the operation the electronic circuitry carried in IC die 102.

Figure 2:
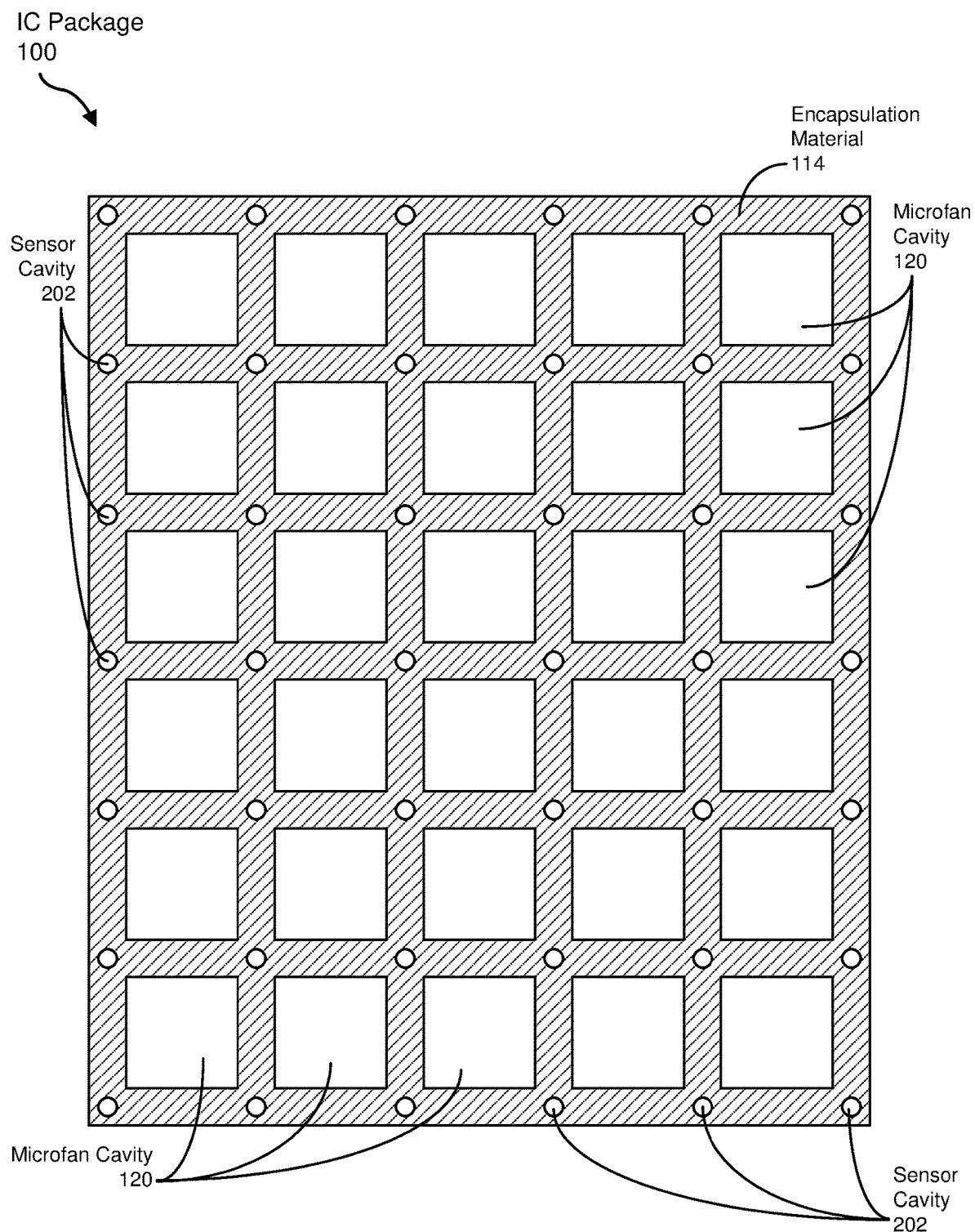
FIG. 2 is a top cross-section of the exemplary IC package of FIG. 1.

FIG. 2 is a top cross-section view of IC package 100 in which encapsulation material 114 defines cavities 120 for microfans in the top surface of encapsulation material 114. As depicted in FIG. 2, each microfan cavity 120 is sized and configured to retain a single microfan (not shown in FIGS. 1 and 2). However, each microfan cavity 120 may be configured to retain two or more microfans in other embodiments. Further, as indicated in FIG. 2, microfan cavities 120 may be aligned in a two-dimensional array or grid. In other examples, microfan cavities 120 may be aligned such that every other row or column of microfan cavities 120 is offset relative to the adjacent rows or columns of microfan cavities 120. In yet other embodiments, microfan cavities 120 may form a checkerboard pattern in encapsulation material 114. Other patterns for microfan cavities 120 are also possible.

Also, as illustrated in FIG. 2, encapsulation material 114 may define a plurality of sensor cavities 202 that are configured to retain sensors (not illustrated in FIG. 2), each of which may generate a signal indicating (in other words, indicative of) a temperature at the location of the sensor. These sensors may include heat sensors, heat flux sensors, temperature sensors, and/or other sensors that provide some indication of temperature at the location of the sensor.

In the particular example of FIG. 2, sensor cavities 202 are aligned in a two-dimensional array or grid such that sensor cavities 202 reside at a center of each two-by-two grouping of microfan cavities 120. Other locations for sensor cavities 202 are also possible, such as, for example, between pairs of microfan cavities 120, underneath microfan cavities 120 (e.g., between each microfan cavity 120 and IC die 102), and the like. In yet other embodiments, the sensors may be located in IC die 102 (e.g., incorporated with other electronic circuitry therein) or atop IC die 102.

Encapsulation material 114, in some examples, may also include space (e.g., pathways) for electrical traces or wires (not shown in FIG. 2) to couple a power supply and/or fan control logic with the microfans and/or sensors.

In some embodiments, encapsulation material 114 may be molded, machined, or otherwise processed to form microfan cavities 120, sensor cavities 202, and/or other cavities therein. In some examples, a layering process (e.g., three-dimensional printing) in which multiple layers of encapsulation material 114 are deposited upon IC die 102 to facilitate generation of the cavities. As shown in FIG. 2, encapsulation material 114 remaining between microfan cavities 120 may facilitate retention of the mechanical strength of encapsulation material 114 that may be desired to protect IC die 102 and other portions of IC package 100. However, a lesser or greater amount of encapsulation material 114 remaining between microfan cavities 120 and/or sensor cavities 202 may be employed in other examples.

Figure 3:
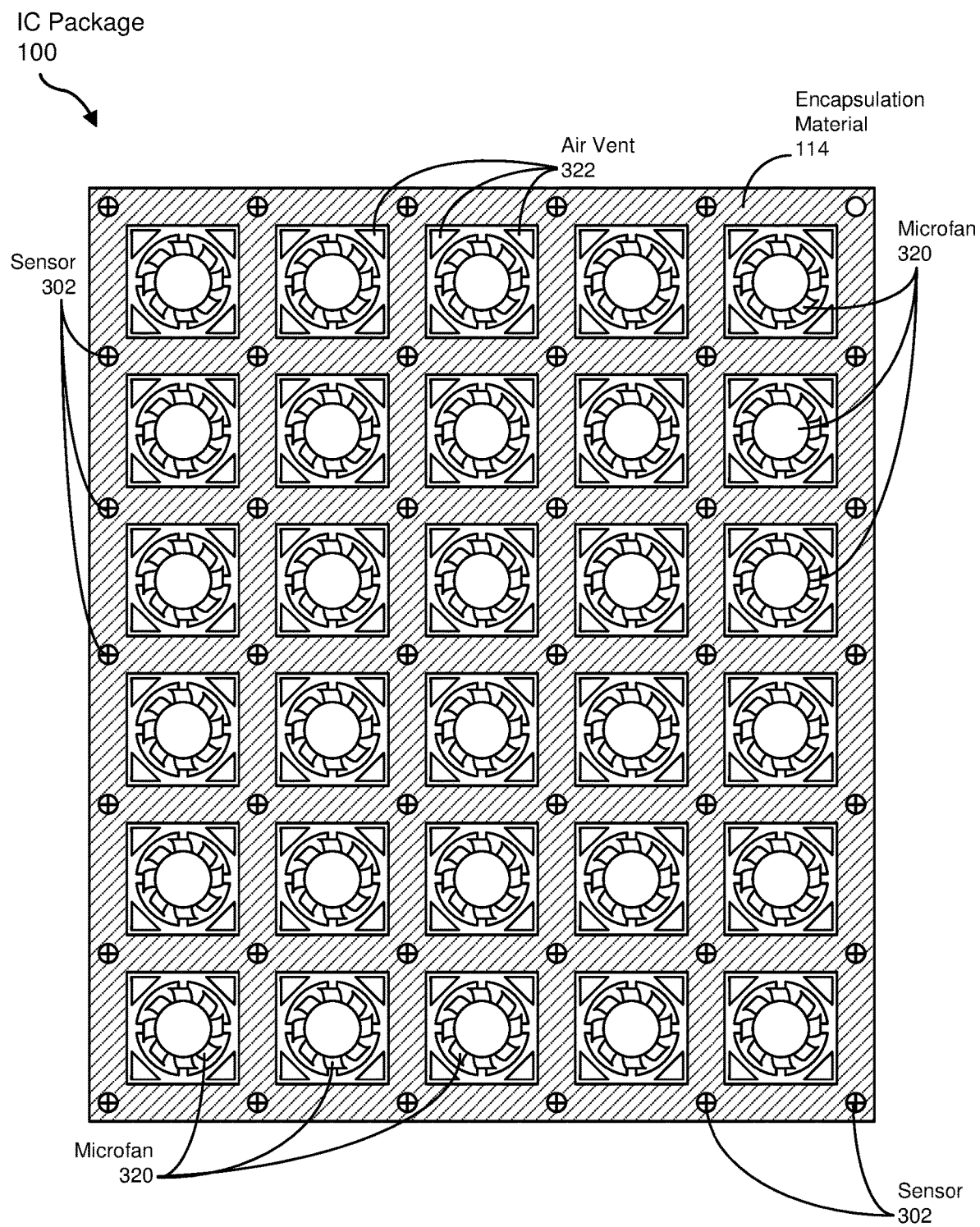
FIG. 3 is a top cross-section of the exemplary IC package of FIGS. 1 and 2 after installation of a plurality of microfans in the IC package.

FIG. 3 is a top cross-section of IC package 100 after installation of a plurality of microfans 320 in corresponding microfan cavities 120 and installation of sensors 302 in sensor cavities 202 in encapsulation material 114. In some examples, a microfan 320 may be a small electrically-driven fan of several millimeters (e.g., 3-10 mm) in width. In some embodiments, microfans 320 are configured to create airflow upward (e.g., upward from IC die 102) to extract heat from IC package 100. In some embodiments, each microfan 320 may be include one or more air vents 322 through which cooler air may be drawn into the corresponding microfan cavity 120 for subsequent extraction via microfan 320. In other embodiments, an air vent for a microfan 320 may be incorporated as a cavity or channel in encapsulation material 114 that couples an exterior of encapsulation material 114 (e.g., at a location adjacent microfan 320) with the corresponding microfan cavity 120. In yet other examples, neither encapsulation material 114 nor microfans 320 may define a separately identifiable air vent.

Figure 4:
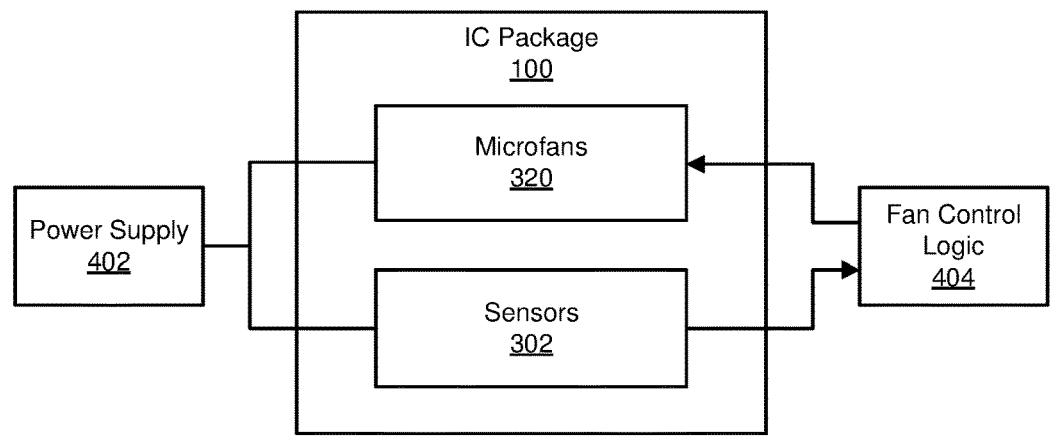
FIG. 4 is a block diagram of an exemplary cooling system including the exemplary IC package of FIGS. 1-3.

FIG. 4 is a block diagram of an exemplary cooling system 400 including microfans 320 and sensors 302, as incorporated in IC package 100. As shown in FIG. 4, cooling system 400 may also include a power supply 402 and fan control logic 404. Also, as depicted in FIG. 4, power supply 402 and fan control logic 404 may reside externally to IC package 100. For example, power supply 402 and fan control logic 404 may reside on a PCB upon which IC package 100 is installed, or in another portion of an electronic system incorporating IC package 100. However, in other examples, power supply 402 and/or fan control logic 404 may be incorporated within IC package 100 (e.g., within or on IC die 102, embedded within encapsulation material 114, or elsewhere). In some embodiments, power supply 402 may supply electrical power to operate microfans 320, sensors 302, and/or fan control logic 404.

Fan control logic 404, in some examples, may be hardware control logic or a small algorithmic controller executing instructions stored in a memory device. Generally, fan control logic 404 may receive signals from one or more sensors 302 that each indicate a temperature at a location of the corresponding sensor 302 and, based on those signals, operate microfans 320 associated with that location.

Figure 5:
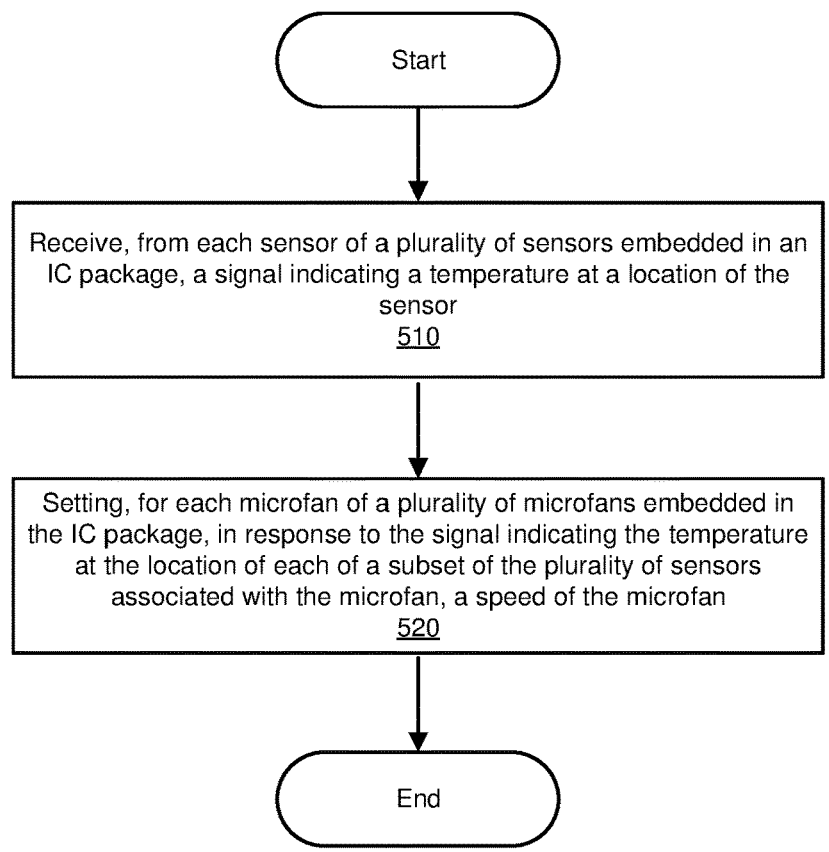
FIG. 5 is a flow diagram of an exemplary method of operating the exemplary cooling system of FIG. 4.

FIG. 5 is a flow diagram of an exemplary method 500 of operating cooling system 400 of FIG. 4. While various embodiments of method 500 are described below in view of IC package 100 as illustrated in FIGS. 1-3, other embodiments of IC package 100, as discussed more generally above, may also benefit from application of method 500.

In method 500, at step 510, a signal may be received (e.g., at fan control logic 404) from each sensor of a plurality of sensors (e.g., sensors 302) embedded in an IC package (e.g., IC package 100) indicating a temperature at a location of the sensor. At step 520, a speed may be set for each microfan of a plurality of microfans (e.g., microfans 320) embedded in the IC package in response to the signal indicating the temperature at the location of each of a subset of the plurality of sensors associated with the microfan. Further, in some examples, the receiving of the signals and the setting of fan speed may be performed continuously, periodically, or repeatedly over at least some length of time.

More specifically, in some embodiments, in response to one or more sensor 302 signals that indicate an elevated temperature at a particular location or area of IC package 100, fan control logic 404 may increase a rotational rate of one or more microfans 320 located at or near the corresponding sensors 302. Oppositely, a decrease in temperature at a particular location of IC package 100, as indicated by one or more sensor 302 signals associated with that location, may result in fan control logic 404 reducing a rotational rate of one or more microfans 320 located at or near the one or more sensors 302 providing those signals. In the environment of FIG. 3, in which sensors 302 are located at corner locations of each microfan 320, each individual microfan 320 may be operated in view of the signals from the four sensors 302 located adjacent to (e.g., at the four corners of) that microfan 320. In some embodiments, the speed of a particular microfan 320 may be based on an average temperature indicated by the signals received from the four sensors 302 at the corners of the particular microfan 320. In other examples, the speed of a specific microfan 320 may be based on a maximum temperature indicated among the signals received from the four corresponding sensors 302. In yet other examples, signals generated by additional sensors 302 near a particular microfan 320, such as those surrounding one or more microfans 320 adjacent the particular microfan 320, also may be considered when setting the speed of the particular microfan 320. In that case, the temperatures indicated by the signals from sensors 302 located more remotely from microfan 320 may be weighted less than the temperatures indicated by the signal from sensors 302 positioned adjacent to microfan 320.

In yet other arrangements of sensors 302, such as a single sensor 302 located near each microfan 320 (e.g., positioned under microfan 320, such as on IC die 102, or between microfan 320 and IC die 102), the rotational speed of a specific microfan 320 may depend solely upon the temperature indicated by the signal generated by the single sensor 302 corresponding to that specific microfan 320. In other embodiments, temperatures indicated by signals associated with other nearby sensors 302, such as each sensor 302 adjacent the single sensor 302, may also be considered when setting the rotational speed of the specific microfan 320. Other relationships between sensors 302 and microfans 320 other than those discussed above are also possible.

As explained above in conjunction with FIGS. 1 through 5, the IC packages described herein, as well as the associated cooling systems and methods discussed above, may facilitate more effective and efficient cooling of an IC package, especially one that exhibits a high TDP that demands an extraordinary level of cooling. More specifically, in some embodiments, heat extraction may be targeted at those portions of the IC package that are currently generating the most heat, and the extraction may be increased or decreased at those specific locations according to the level of heat being detected at the time. Additionally, compared to a heat sink or other passive technology, the cooling system embodiments discussed herein may consume much less volume above the IC package being cooled, possibly resulting in a lower-profile electronic device that employs the IC package.

EXAMPLE EMBODIMENTS

Example 1: An integrated circuit (IC) package may include (1) an IC die carrying electronic circuitry, (2) an encapsulation material at least partially covering the IC die, where the encapsulation material defines a plurality of cavities in a top surface of the encapsulation material, (3) a plurality of microfans located in the plurality of cavities, and (4) a plurality of sensors, where each sensor of the plurality of sensors produces a signal indicating a temperature at a location of the sensor.

Example 2: The IC package of Example 1, where each of the plurality of cavities may be configured to hold a corresponding one of the plurality of microfans.

Example 3: The IC package of either Example 1 or Example 2, where the plurality of cavities may be arranged in a two-dimensional array along the top surface of the encapsulation material.

Example 4: The IC package of any one of Examples 1-3, where the plurality of sensors may be arranged in a two-dimensional array parallel to the top surface of the encapsulation material.

Example 5: The IC package of Example 4, where each of the plurality of sensors may be aligned vertically relative to each of the plurality of microfans.

Example 6: The IC package of Example 4, where each of at least some of the plurality of sensors may be aligned vertically relative to space between adjacent ones of the plurality of microfans.

Example 7: The IC package of any one of Examples 1-3, where each of the plurality of microfans may be configured to create airflow upward from the top surface of the encapsulation material.

Example 8: The IC package of any one of Examples 1-3, where the encapsulation material may further define at least one air vent communicatively coupled to at least one of the plurality of cavities such that air is drawn through the air vent into the at least one of the plurality of cavities.

Example 9: The IC package of any one of Examples 1-3, where each of the plurality of microfans may define at least one air vent such that air is drawn through the air vent into the at least one of the plurality of cavities.

Example 10: A cooling system for an IC package may include (1) a plurality of microfans located in a plurality of cavities in a top surface of an encapsulation material of the IC package, where the encapsulation material at least partially covers an IC die carrying electronic circuitry, (2) a plurality of sensors located in the IC package, where each sensor of the plurality of sensors produces a signal indicating a temperature at a location of the sensor, and (3) fan control logic that (a) receives, from each sensor of the plurality of sensors, the signal indicating the temperature at the location of the sensor, and (b) sets, for each microfan of the plurality of microfans, in response to the signals indicating the temperature at the location of each of a subset of the plurality of sensors associated with the microfan, a speed of the microfan.

Example 11: The cooling system of Example 10, where the fan control logic may set the speed of each microfan of the plurality of microfans in response to the signal from one sensor of the plurality of sensors closest to the microfan.

Example 12: The cooling system of Example 11, where the one sensor of the plurality of sensors closest to the microfan may be located vertically relative to the microfan.

Example 13: The cooling system of Example 10, where the fan control logic may set the speed of each microfan of the plurality of microfans in response to the signals from more than one sensor of the plurality of sensors closest to the microfan.

Example 14: The cooling system of Example 13, where the more than one sensor of the plurality of sensors closest to the microfan may be adjacent the microfan.

Example 15: The cooling system of Example 13, where the fan control logic may set the speed of each microfan of the plurality of microfans in response to an average of the temperatures at the location of each of the more than one sensor of the plurality of sensors closest to the microfan.

Example 16: The cooling system of Example 13, where the fan control logic may set the speed of each microfan of the plurality of microfans in response to a maximum of the temperatures at the location of each of the more than one sensor of the plurality of sensors closest to the microfan.

Example 17: A method of cooling an IC package may include (1) receiving, from each sensor of a plurality of sensors included in the IC package that includes an IC die carrying electronic circuitry within the IC package, a signal indicating a temperature at a location of the sensor, and (2) setting, for each microfan of a plurality of microfans located in a plurality of cavities in a top surface of an encapsulation material at least partially covering the IC die, in response to the signals indicating the temperature at the location of each of a subset of the plurality of sensors associated with the microfan, a speed of the microfan.

Example 18: The method of Example 17, where the speed of each microfan of the plurality of microfans may be set in response to the signal from one sensor of the plurality of sensors closest to the microfan.

Example 19: The method of Example 17, where the speed of each microfan of the plurality of microfans may be set in response to the signals from more than one sensor of the plurality of sensors closest to the microfan.

Example 20: The method of Example 19, where the speed of each microfan of the plurality of microfans may be based on a maximum value of the temperatures at the location of each of the more than one sensor.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An integrated circuit (IC) package comprising:
    an IC die carrying electronic circuitry;
    an encapsulation material at least partially covering the IC die and positioned between a plurality of cavities and the IC die, wherein the encapsulation material defines the plurality of cavities in a top surface of the encapsulation material;
    a plurality of microfans located in the plurality of cavities; and
    a plurality of sensors, wherein each sensor of the plurality of sensors produces a signal indicating a temperature at a location of the sensor.

2. The IC package of claim 1, wherein each microfan of the plurality of microfans located in each of the plurality of cavities is embedded within the encapsulation material.

3. The IC package of claim 1, wherein the plurality of cavities and the plurality of sensors are arranged in a two-dimensional array along the top surface of the encapsulation material.

4. The IC package of claim 1, wherein each of the plurality of microfans is configured to create airflow upward from the top surface of the encapsulation material.

5. The IC package of claim 1, wherein the encapsulation material further defines at least one air vent communicatively coupled to at least one of the plurality of cavities such that air is drawn through the air vent into the at least one of the plurality of cavities.

6. The IC package of claim 1, wherein each of the plurality of microfans defines at least one air vent such that air is drawn through the air vent into the at least one of the plurality of cavities.

7. The IC package of claim 1, wherein the encapsulation material is positioned between the plurality of cavities and the IC die in a manner that facilitates retention of mechanical strength of the encapsulation material.

8. The IC package of claim 1, wherein the encapsulation material is molded over the IC die in a manner that provides protection for the IC die.

9. The IC package of claim 1, wherein each sensor of the plurality of sensors is embedded within the encapsulation material.

10. A cooling system for an IC package, the cooling system comprising:
    a plurality of microfans located in a plurality of cavities in a top surface of an encapsulation material of the IC package, wherein the encapsulation material is positioned between the plurality of cavities and an IC die and at least partially covers the IC die carrying electronic circuitry;

a plurality of sensors located in the IC package, wherein each sensor of the plurality of sensors produces a signal indicating a temperature at a location of the sensor; and fan control logic that:
 receives, from each sensor of the plurality of sensors, the signal indicating the temperature at the location of the sensor; and
 sets, for each microfan of the plurality of microfans, in response to the signals indicating the temperature at the location of each of a subset of the plurality of sensors associated with the microfan, a speed of the microfan.

11. The cooling system of claim 10, wherein the fan control logic sets the speed of each microfan of the plurality of microfans in response to the signal from one sensor of the plurality of sensors closest to the microfan.

12. The cooling system of claim 10, wherein the fan control logic sets the speed of each microfan of the plurality of microfans in response to the signals from more than one sensor of the plurality of sensors closest to the microfan.

13. The cooling system of claim 12, wherein the fan control logic sets the speed of each microfan of the plurality of microfans in response to an average of the temperatures at the location of each of the more than one sensor of the plurality of sensors closest to the microfan.

14. The cooling system of claim 12, wherein the fan control logic sets the speed of each microfan of the plurality of microfans in response to a maximum of the temperatures at the location of each of the more than one sensor of the plurality of sensors closest to the microfan.

15. The cooling system of claim 10, wherein the encapsulation material includes pathways for electrical traces or wires to couple a power supply and the fan logic to the plurality of microfans and the plurality of sensors.

16. The cooling system of claim 15, wherein at least one of the power supply and the fan logic is embedded within the encapsulation material in the IC package.

17. A method of cooling an IC package, the method comprising:
 receiving, from each sensor of a plurality of sensors included in the IC package that includes an IC die carrying electronic circuitry, a signal indicating a temperature at a location of the sensor; and
 setting, for each microfan of a plurality of microfans located in a plurality of cavities in a top surface of an encapsulation material that is positioned between the plurality of cavities and the IC die and at least partially covering the IC die, in response to the signals indicating the temperature at the location of each of a subset of the plurality of sensors associated with the microfan, a speed of the microfan.

18. The method of claim 17, wherein the speed of each microfan of the plurality of microfans is set in response to the signal from one sensor of the plurality of sensors closest to the microfan.

19. The method of claim 17, wherein the speed of each microfan of the plurality of microfans is set in response to the signals from more than one sensor of the plurality of sensors closest to the microfan.

20. The method of claim 19, wherein the speed of each microfan of the plurality of microfans is based on a maximum value of the temperatures at the location of each of the more than one sensor.

* * * * *